United States Patent
Mieyan et al.

(10) Patent No.: US 11,217,927 B2
(45) Date of Patent: Jan. 4, 2022

(54) CARRIER FOR A BATTERY FOR SUPPLYING POWER TO AN ELECTRONIC CIRCUIT

(71) Applicants: Continental Automotive France, Toulouse (FR); Continental Automotive GmbH, Hannover (DE)

(72) Inventors: Jérémy Mieyan, Saiguede (FR); Gilles Capdepon, Vernet (FR)

(73) Assignees: CONTINENTAL AUTOMOTIVE FRANCE, Toulouse (FR); CONTINENTAL AUTOMOTIVE GMBH, Hannover (DE)

(*) Notice: Subject to any disclaimer, the term of this patent is extended or adjusted under 35 U.S.C. 154(b) by 0 days.

(21) Appl. No.: 16/761,916

(22) PCT Filed: Nov. 16, 2018

(86) PCT No.: PCT/FR2018/052878
§ 371 (c)(1),
(2) Date: May 6, 2020

(87) PCT Pub. No.: WO2019/106255
PCT Pub. Date: Jun. 6, 2019

(65) Prior Publication Data
US 2020/0328546 A1 Oct. 15, 2020

(30) Foreign Application Priority Data
Nov. 30, 2017 (FR) ...................... 1761396

(51) Int. Cl.
*H01R 13/187* (2006.01)
*B60C 23/04* (2006.01)
(Continued)

(52) U.S. Cl.
CPC ......... *H01R 13/187* (2013.01); *B60C 23/041* (2013.01); *B60C 23/0479* (2013.01); *H01R 13/2414* (2013.01); *H05K 3/284* (2013.01)

(58) Field of Classification Search
None
See application file for complete search history.

(56) References Cited

U.S. PATENT DOCUMENTS 8,052,462 B2 * 11/2011 King, Jr. .............. H01R 27/02
439/441
2006/0141828 A1 6/2006 Dean et al.

FOREIGN PATENT DOCUMENTS

CA 2674254 A1 1/2011
CN 203331758 U 12/2013
(Continued)

OTHER PUBLICATIONS

International Search Report and Written Opinion for International Application No. PCT/FR2018/052878, with partial English translation, dated Feb. 14, 2019, 8 pages.
(Continued)

*Primary Examiner* — Ross N Gushi
(74) *Attorney, Agent, or Firm* — RatnerPrestia

(57) ABSTRACT

An electrical connection system for connecting two electrical devices, including at least one elastic contact integral with a first electrical device and in elastic abutment against a second electrical device so as to form an electrical connection. The at least one elastic contact being able to deform in a deformation plane. At least one wall placed so that the elastic contact is placed between the wall and the second electrical device in the deformation plane. The at least one elastic contact, the at least one wall, and the second electrical device being coated in a protective material after assembly.

6 Claims, 3 Drawing Sheets

(51) Int. Cl.
*H01R 13/24* (2006.01)
*H05K 3/28* (2006.01)

(56) References Cited

FOREIGN PATENT DOCUMENTS

| | | |
|---|---|---|
| CN | 204289552 U | 4/2015 |
| CN | 205056615 U | 3/2016 |
| EP | 2574479 A1 | 4/2013 |

OTHER PUBLICATIONS

International Search Report and Written Opinion for International Application No. PCT/FR2018/052878, dated Feb. 14, 2019, 12 pages (French).
Chinese Office Action for Chinese Application No. 201880077328.X, dated Feb. 7, 2021 with translation, 11 pages.

* cited by examiner

CARRIER FOR A BATTERY FOR SUPPLYING POWER TO AN ELECTRONIC CIRCUIT

CROSS REFERENCE TO RELATED APPLICATIONS

This application is the U.S. National Phase Application of PCT International Application No. PCT/FR2018/052878, filed Nov. 16, 2018, which claims priority to French Patent Application No. 1761396, filed Nov. 30, 2017, the contents of such applications being incorporated by reference herein.

FIELD OF THE INVENTION

The technical field of the invention is electrical connection systems, and more particularly electrical connection systems for over-molded electronic circuits.

BACKGROUND OF THE INVENTION

Systems for monitoring the pressure of tires, also known as TPMSs (Tire Pressure Monitoring Systems), have been rolled out to most motor vehicles following revisions to the European standards concerned with motor vehicle safety equipment.

Such TPMSs are currently supplied with power by batteries connected to the TPMS circuit board by metal strips that are soldered to the battery and to the TPMS circuit board.

However, the soldering process is long, expensive and contaminates the electronics, and hence it is advantageous to remove it from the production steps of TPMS devices.

Moreover, the use of leaf springs, soldered to a circuit board and in abutment against the battery, is known for other applications.

Up to now it has not been possible to employ this technology in the context of a simple replacement of soldered strips when the circuit board and the battery are coated with a protective material such as polyurethane. Specifically, at high temperature, the difference between the expansion of the protective material, of the battery, of the strips and of the holder tends to separate the leaf springs from the battery. A decrease in electrical contact pressure until break of the supply results.

SUMMARY OF THE INVENTION

There is therefore a problem of insufficient contact pressure between the leaf spring and the battery at high temperature when the leaf spring is over-molded.

An aspect of the invention is an electrical connection system for connecting two electrical devices, comprising:
  at least one elastic contact means integral with a first electrical device and in elastic abutment against a second electrical device so as to form an electrical connection,
  the at least one elastic contact means being able to deform in a deformation plane,
  at least one wall placed so that the elastic contact means is placed between the wall and the second electrical device in the deformation plane,
  the at least one elastic contact means, the at least one wall and the second electrical device being coated in a protective material after assembly.

The elastic contact means may be a leaf spring.

The electrical connection system may comprise at least one stopping means placed so as to oppose the movement of the second electrical device under the action of the elastic abutment due to at least one elastic contact means.

The stopping means may be a stop.

The second electrical device may be a battery.

The first electrical device may be an electronic circuit.

The electrical connection system has the advantage of allowing elastic contact means to be used with over-molded electronics.

BRIEF DESCRIPTION OF THE DRAWINGS

Other aims, features and advantages of aspects of the invention will become apparent on reading the following description, given solely by way of nonlimiting example, and with reference to the appended drawings, in which.

DETAILED DESCRIPTION OF THE PREFERRED EMBODIMENTS

Figure 1:
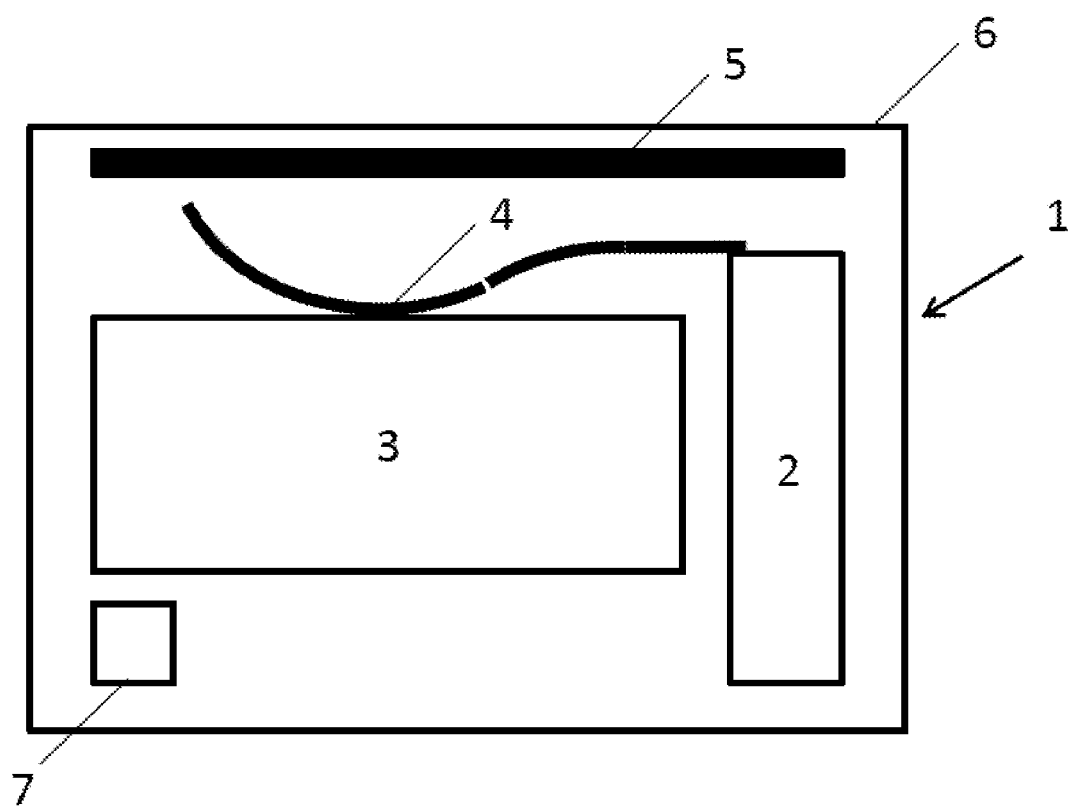
FIG. 1 illustrates the main elements.

In FIG. 1, a first embodiment of an electrical connection system according to an aspect of the invention may be seen.

The electrical connection system 1 is able to connect a first electrical device 2 to a second electrical device 3 via an elastic contact means 4 that is mechanically and electrically integral with the first electrical device 2 and in elastic abutment against an electrical contact surface of the second electrical device 3.

After assembly, the electrical connection system 1 and the two electrical devices 2, 3 are coated in a protective material, such as polyurethane for example.

When the temperature seen by the electrical connection system 1 increases, each of these components expands. However, as each component has a different coefficient of thermal expansion, differences in expansion appear. These differences may generate forces that oppose the elastic abutment force of the elastic contact means 4, leading to a decrease in the contact force, or even to a break of the contact.

Among the various components, the coating material is the component that has the highest coefficient of expansion. Because it is placed in all the cavities and gaps of the connection system, it may generate a force due to expansion that opposes the elastic abutment force. This is especially the case for the coating material placed between the second electrical device 3 and the elastic contact means 4.

A wall 5 allows the coating material placed between the elastic contact means 4 and the wall 5 to generate another expansion force that contributes to the elastic abutment of the elastic contact means 4 against the second electrical device 3.

In order for the wall 5, the first electrical device 2 and the second electrical device 3 to remain in substantially similar positions, provision is made for a holder 6 to which these various elements are fastened by a stopping means 7, either securely via soldering or adhesive bonding to the holder 6, or removably by way of clips, clamps or stops. Such a stopping means 7 is illustrated in FIG. 1 and prevents the movement of the second electrical device 3 under the action of the elastic contact means 4 and of the expansion of the coating material.

Thus, only the elastic contact means 4 can move, because of its elastic properties and of the fact that it is fastened at one end to the first electrical device 2.

However, as explained above, the presence of the wall 5 allows the pressing forces seen by the elastic contact means 4 due to the expansion of the coating material to be equilibrated. The contact between the elastic contact means 4 and the second electrical device 3 is then not influenced by the expansion of the coating material.

Figure 2:
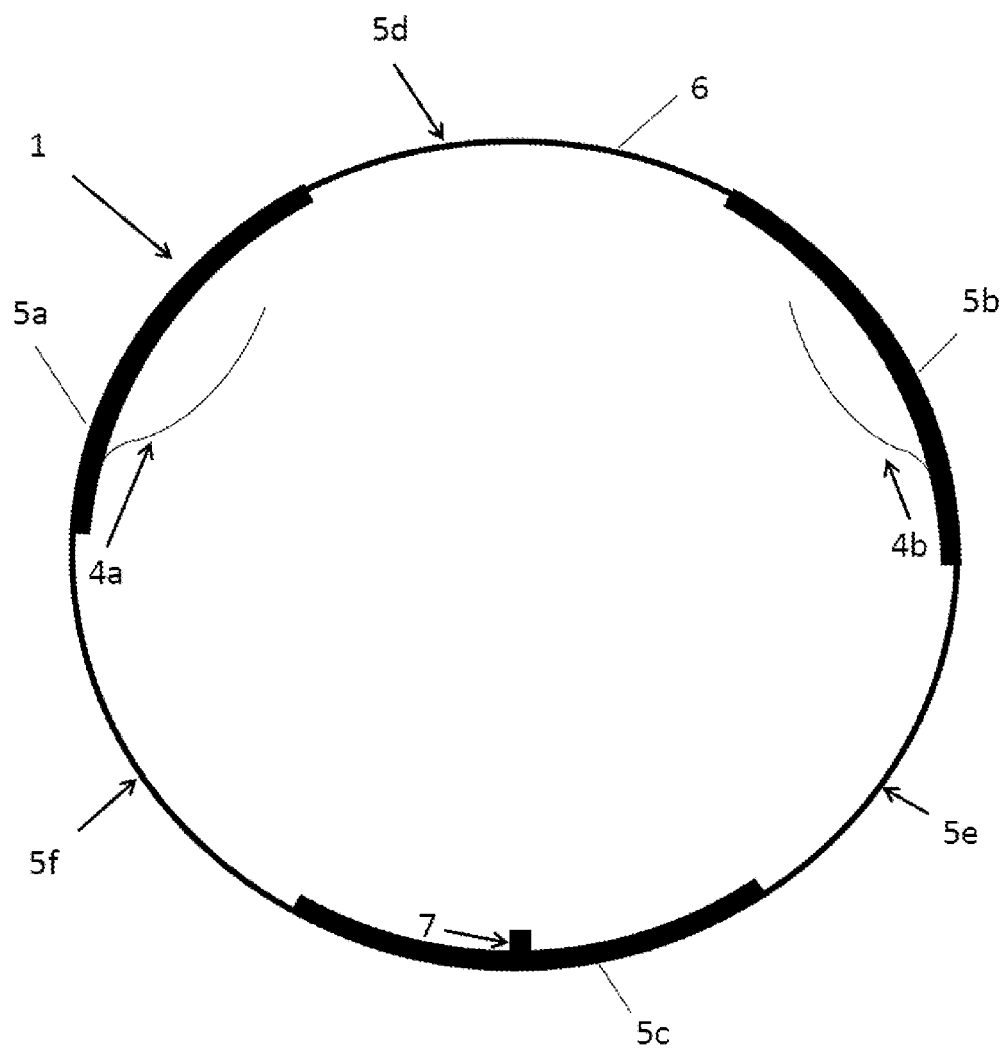
FIG. 2 illustrates the main elements of a battery holder according to an aspect of the invention before insertion of the battery.

In FIG. 2, another embodiment of an electrical connection system may be seen. Elements that are similar to the elements of the first embodiment illustrated in FIG. 1 bear the same references. The electrical connection system comprises a holder 6 and a wall 5 placed on the periphery of the holder 6.

The wall 5 is sectional and has unapertured sections 5*a*, 5*b*, 5*c* and apertured sections 5*d*, 5*e*, 5*f*.

The unapertured sections may each be equipped with an elastic contact means 4*a*, 4*b* or a stopping means 7. The elastic contact means 4*a*, 4*b* are able to move in a direction comprised in a plane parallel to the holder 6.

Figure 3:
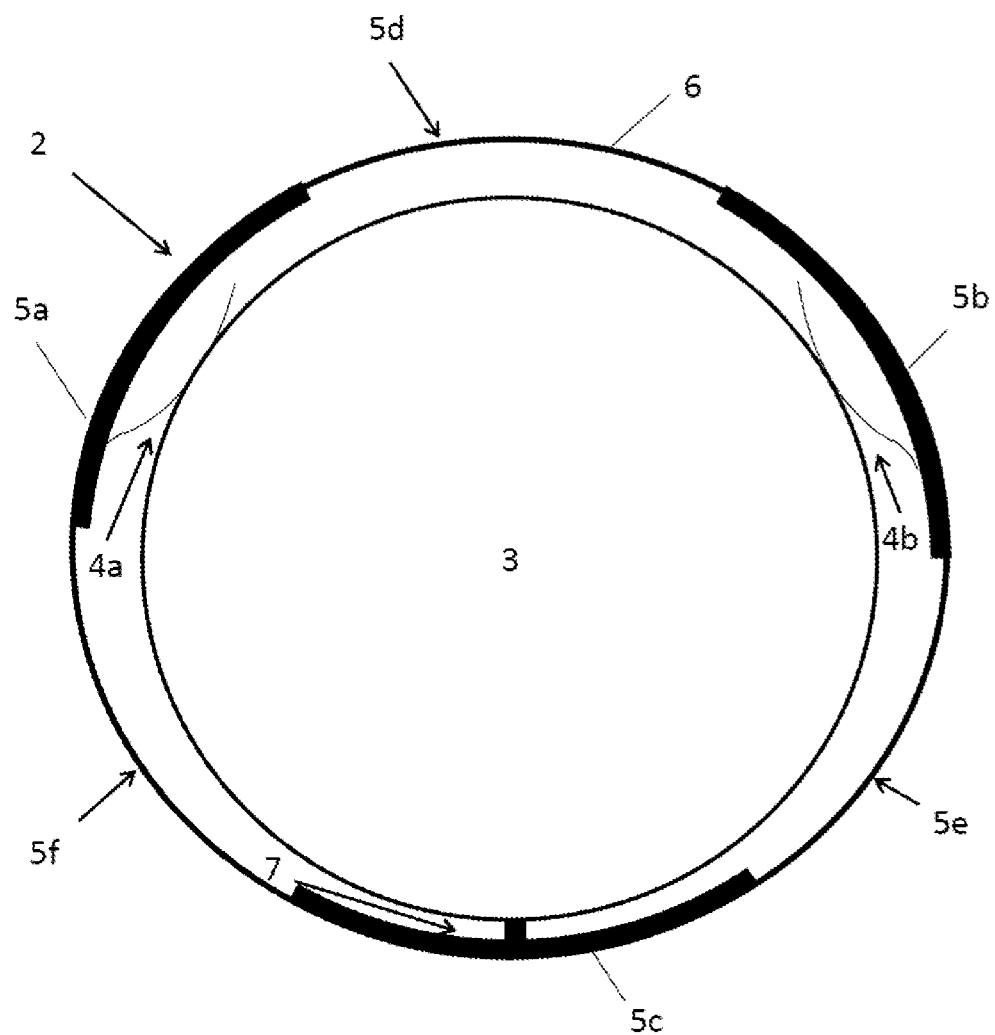
FIG. 3 illustrates the main elements of a battery holder according an aspect of to the invention after insertion of the battery.

In FIG. 3, the second embodiment of the electrical connection system 1 illustrated in FIG. 1 may be seen, into which system a second electrical device 3 has been inserted. The insertion of the second electrical device 3 into contact with the holder 6 deforms the elastic contact means 4*a*, 4*b* so that they each apply, to the second electrical device 3, a force that depends on their stiffness coefficient. The stopping means 7 generates a reaction force that prevents the movement of the second electrical device 3, which is thus held in place by the forces applied by the elastic contact means 4*a*, 4*b* and by the stopping means 7.

The second electrical device 3 may be a battery of flat-top-cell or button-cell type.

A first electrical device 2 may be present on the back of the holder 6 and connected to the second electronic device 3 by way of the elastic contact means 4*a*, 4*b*.

The first electrical device 2 may be an electronic circuit.

FIGS. 2 and 3 show connection systems equipped with walls 5 comprising three unapertured sections of same size. However, those skilled in the art will understand that any number of unapertured sections, of equal or different size, may be employed.

Likewise, FIGS. 2 and 3 show the use of elastic contact means 4*a*, 4*b* and one stopping means 7. However, any number of elastic contact means 4*a*, 4*b* may be employed, provided that there is at least one elastic contact means. The second electrical device 3 is held stably in the holder provided that it is subjected to at least three forces via the use of elastic contact means 4*a*, 4*b* or a combination of elastic contact means 4*a*, 4*b* and stopping means 7.

Lastly, the stopping means 7 of FIGS. 2 and 3 are illustrated in the form of a pin or stop that extends radially. However, other forms may be employed without changing the obtained effect of a force that opposes the movement of the battery. The stopping means 7 may also simply be an unapertured section 5*a*, 5*b*, 5*c* of the wall 5.

During the coating of the holder 6 and of the electrical circuits 2, 3 in a coating material, the apertured sections 5*d*, 5*e*, 5*f* of the wall 5 allow the coating material to flow and air contained in the system to be evacuated.

The elastic contact means 4*a*, 4*b* may be leaf springs designed, with regard to their dimensions and their stiffness coefficient, so as to present a space between their end and the unapertured section of the sidewall to which they are fastened. Thus, the protective material may also penetrate into the space between the unapertured section of the sidewall and the leaf spring fastened to said unapertured section.

Similarly to the effect of the expansion of the coating material described in the first embodiment, when the coated connection system is subjected to an increase in temperature, the coating material expands at every point thereof. This results in the appearance of isotropic pressing forces the origin of which is the center of the space between the unapertured section of the sidewall and the leaf spring.

When the wall 5 is arranged so that the elastic contact means 4*a*, 4*b* are placed between the wall 5 and the second electrical device 3 in the deformation plane of the elastic contact means 4*a*, 4*b*, these pressing forces oppose the pressing forces generated by the coating material outside the space between the unapertured section 5*a*, 5*b*, 5*c* of the wall and the elastic contact means 4*a*, 4*b* in the direction of the elastic contact means 4*a*, 4*b*, and add to the force generated by the deformation of the elastic contact means 4*a*, 4*b* due to the presence of the second electrical device 3. Thus, at high temperature, the contact between the second electrical device 3 and the elastic contact means 4*a*, 4*b* is maintained partially by virtue of the expansion of the coating material in the space between the unapertured section of the sidewall and the corresponding elastic contact means 4*a*, 4*b*.

At the stop 7, the expansion of the coating material generates a pressing force in the direction of the second electrical device 3 so that it contributes positively to the contact between the second electrical device 3 and the elastic contact means 4*a*, 4*b*.

By virtue of the ingenious design of the holder and of the leaf springs and their interaction with the protective material, it is possible to achieve a permanent contact between the leaf springs and the battery, this allowing a supply of electrical power to be obtained independently of temperature.

The invention claimed is:

1. An electrical connection system for connecting two electrical devices, comprising:
   at least one elastic contact integral with a first electrical device and in elastic abutment against a second electrical device so as to form an electrical connection,
   the at least one elastic contact being able to deform in a deformation plane,
   at least one wall placed so that the elastic contact is placed between the wall and the second electrical device in the deformation plane,
   the at least one elastic contact, the at least one wall and the second electrical device being coated in a protective material after assembly,
   wherein the second electrical device is a battery.

2. The electrical connection system as claimed in claim 1, wherein the elastic contact is a leaf spring.

3. The electrical connection system as claimed in claim 2, comprising at least one stopping means placed so as to oppose the movement of the second electrical device under the action of the elastic abutment due to at least one elastic contact.

4. The electrical connection system as claimed in claim 1, comprising at least one stopping means placed so as to oppose the movement of the second electrical device under the action of the elastic abutment due to the at least one elastic contact.

5. The electrical connection system as claimed in claim 4, wherein the stopping means is a stop.

6. The electrical connection system as claimed in claim 1, wherein the first electrical device is an electronic circuit.

\* \* \* \* \*